United States Patent [19]
Nashimoto

[11] Patent Number: 5,852,703
[45] Date of Patent: Dec. 22, 1998

[54] FERROELECTRIC THIN FILM ELEMENT AND PRODUCTION METHOD THEREOF

[75] Inventor: Keiichi Nashimoto, Minami-ashigara, Japan

[73] Assignee: Fuji Xerox Co., Ltd., Tokyo, Japan

[21] Appl. No.: 867,842

[22] Filed: Jun. 3, 1997

[30] Foreign Application Priority Data

Jun. 7, 1996 [JP] Japan .................................. 8-168339

[51] Int. Cl.⁶ ...................................................... G02B 6/10
[52] U.S. Cl. ........................... 385/130; 505/191; 257/295
[58] Field of Search ................................ 385/7, 10, 130, 385/141, 147; 29/25, 42; 427/126.3, 62, 255.2; 257/295, 33; 505/238, 190, 239, 702, 191; 428/620, 629, 655, 700, 701, 702

[56] References Cited

U.S. PATENT DOCUMENTS

| | | | |
|---|---|---|---|
| 5,155,658 | 10/1992 | Inam et al. | 365/145 |
| 5,168,420 | 12/1992 | Ramesh et al. | 29/25.42 |
| 5,326,721 | 7/1994 | Summerfelt | 427/126.3 |
| 5,434,126 | 7/1995 | Ichikaa et al. | 505/238 |
| 5,472,935 | 12/1995 | Yandrofski et al. | 505/210 |
| 5,473,171 | 12/1995 | Summerfelt | 357/183 |
| 5,677,970 | 10/1997 | Nashimoto | 385/7 |
| 5,753,300 | 5/1998 | Wessels et al. | 427/126.3 |

FOREIGN PATENT DOCUMENTS

| | | |
|---|---|---|
| B2 62-27482 | 6/1987 | Japan . |
| A 5-342912 | 12/1993 | Japan . |
| A 7-78508 | 3/1995 | Japan . |

OTHER PUBLICATIONS

"Growth and Properties of $LiNbO_3$ Film on Sapphire with an $LiNbO_{3\,Buffer\,Layer}$."*Electronic Letters*, 19 Nov. 1987, vol. 23, No. 24, pp. 1321–1323.

Nashimoto, Keiichi and Cima, Michael. "Epitaxial $LiNbO_3$ Thin Films Prepared by a Sol–gel Process." *Materials Letters*, Jan. 1991, vol. 10, No. 7, 8, pp. 348–354.

Wernberg, Alex, Braunstein, Gabriel, Gysling, Henry. "Improved Solid Phase Epitaxial Growth of Lithium Tantalate thin Films on Sapphire, using a two–step Metalorganic Chemical–Vapor Deposition Process." *Applied Physics Letters*, 8 Nov. 1993, vol. 63, No. 19, pp. 2649–2651.

Clem, P.G. and Payne, D.A. "Control of Heteroepitaxy in Sol–Gel Derived $LiNbO_3$ Thin Layers."*Mat. Res. Soc. Symp. Proc.*, vol. 361, pp. 179–184.

*Primary Examiner*—Akm E. Ullah
*Attorney, Agent, or Firm*—Oliff & Berridge, PLC

[57] ABSTRACT

The present invention is to provide a production method of a ferroelectric thin film element comprising an epitaxial ferroelectric thin film having stable composition control, an optical smoothness of the surface, and a high crystallization. In the production method, carrying out a first solid phase epitaxial growth process where a first organometallic compound is applied on the single-crystalline substrate and heated to form a ferroelectric buffer layer on a single-crystalline substrate, having a composition different from the substrate with a film thickness of 1 nm to 40 nm; carrying out at least once a second solid phase epitaxial growth process where a second organometallic compound is applied on the ferroelectric buffer layer formed in the above process and heated to form a ferroelectric single layer thin film with a film thickness of 10 nm or more, and being thicker than the ferroelectric buffer layer.

14 Claims, 8 Drawing Sheets

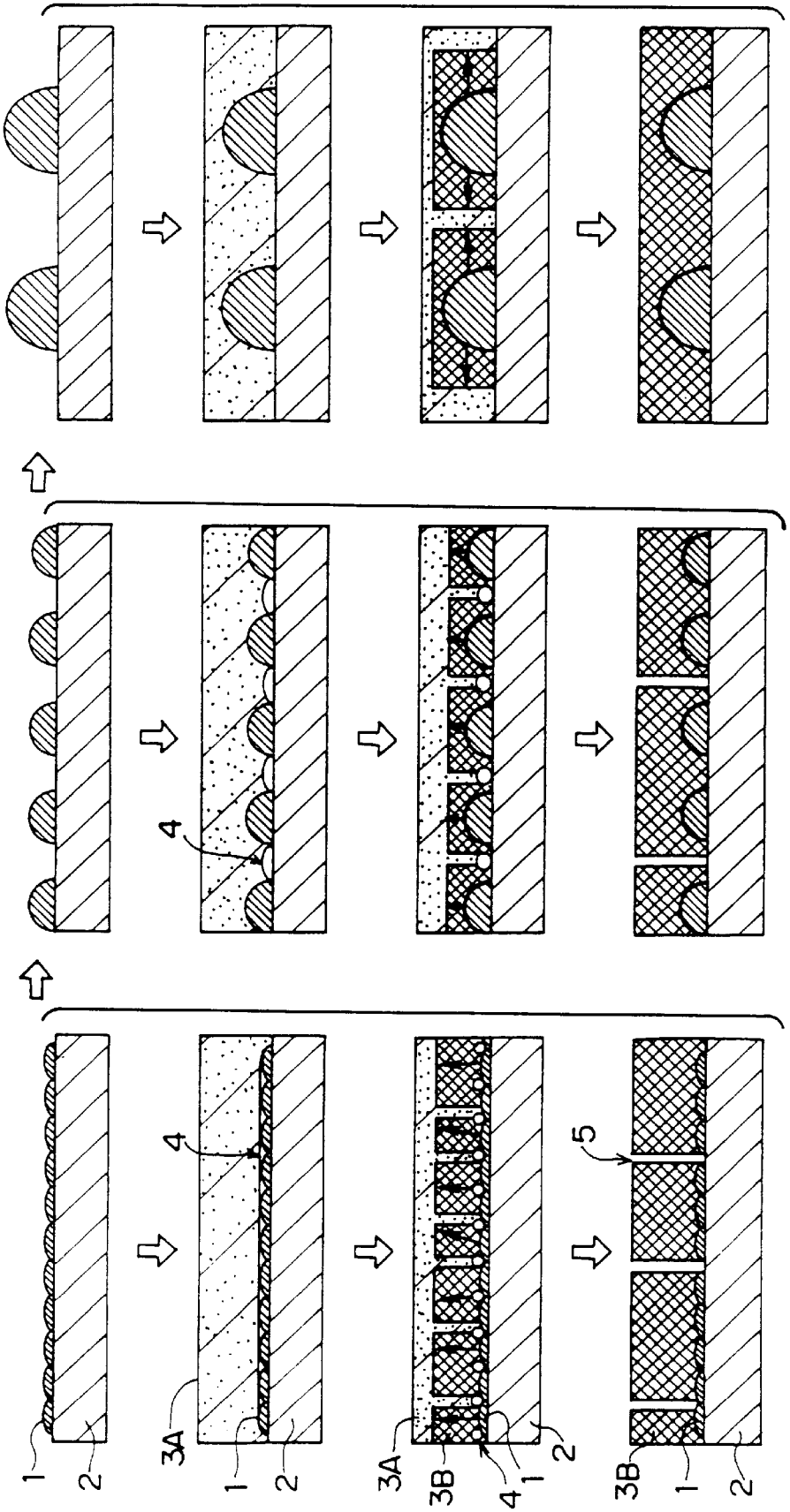

F I G. 5
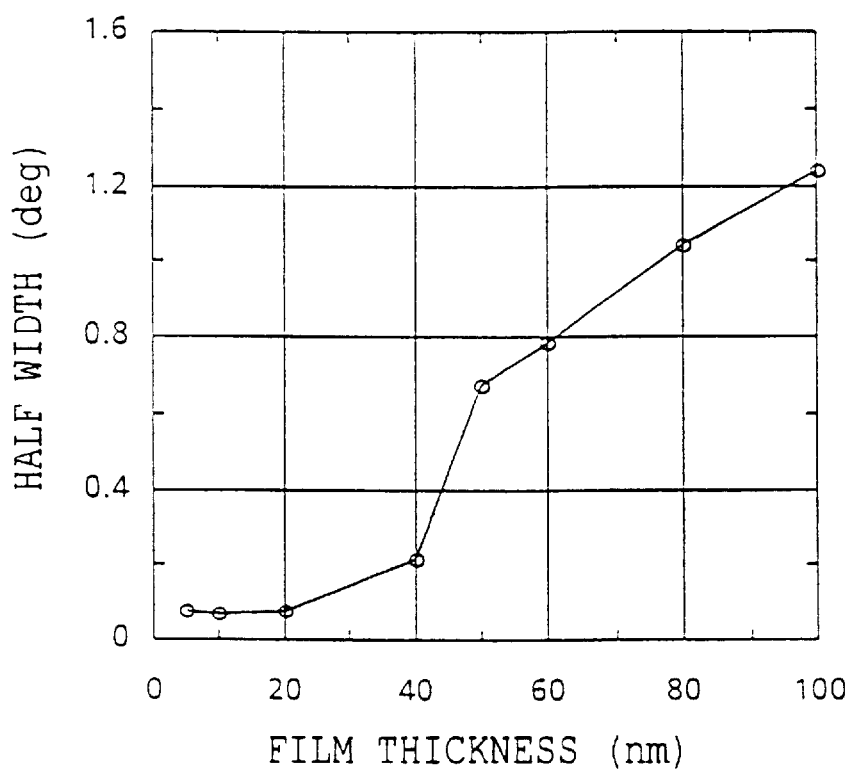

F I G. 6
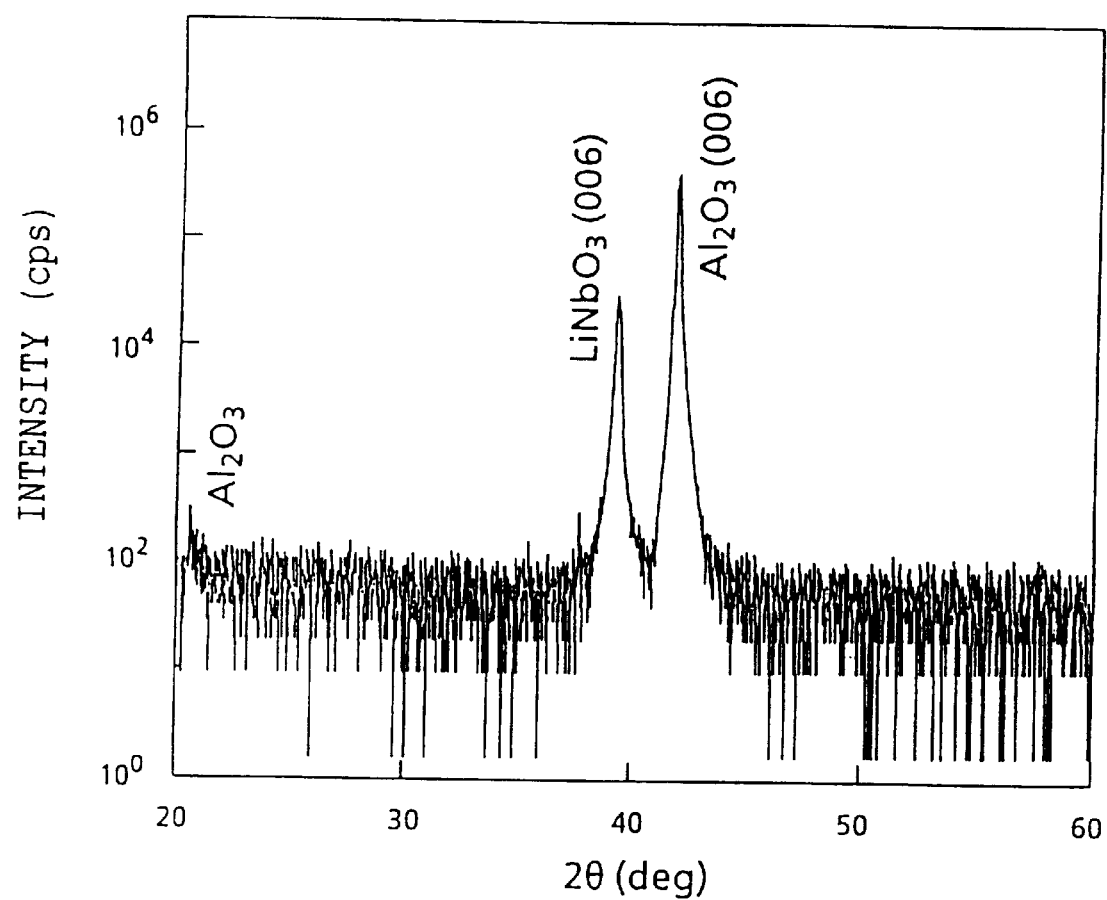
X-RAY DIFFRACTION PATTERN OF AN LINBO₃ FILM
OF THE PRESENT INVENTION X-RAY ROCKING CURVE OF AN LINBO₃ FILM OF THE PRESENT
INVENTION (A) AND AN X-RAY ROCKING CURVE OF AN
LINBO₃ FILM OBTAINED BY A CONVENTIONAL METHOD (B)

X-RAY DIFFRACTION PATTERN OF AN LINBO₃ FILM
OBTAINED BY CONVENTIONAL METHOD

FERROELECTRIC THIN FILM ELEMENT AND PRODUCTION METHOD THEREOF

BACKGROUND OF THE INVENTION

1. Field of the Invention

The present invention relates to a ferroelectric thin film element usable in elements having an optical waveguide structure such as a second harmonic element, an optical switch, and a light modulation element and a production method of, and more particularly, to a method of producing a single-crystalline ferroelectric thin film element comprising an epitaxial growth on a single-crystalline substrate by heating an organometallic compound to cause crystallization, capable of providing a precisely controlled composition, surface optical smoothness, and high crystallization.

2. Description of the related art

Owing to excellent characteristics of ferroelectric such as non-linear optical effects and electro-optical effects, oxide ferroelectric thin film elements are expected to be used in various applications such as second harmonic elements, optical switches and optical modulation elements. Conventionally, these elements have an optical waveguide structure obtained by treating a single-crystalline wafer of $LiNbO_3$ or $LiTaO_3$ with the thermal diffusion of Ti or the exchange of ions and protons. On the other hand, a thin film optical waveguide structure on a single-crystalline substrate by the heteroepitaxial growth of a ferroelectric thin film which material is different from the substrate, may provide a high efficiency of a second harmonic element, a low driving voltage of an optical switch or an optical modulation element, and further, production of a photonic integrated element. However, in order to apply a thin film optical waveguide produced by the heteroepitaxial growth of a ferroelectric thin film to a second harmonic element, an optical switch, or an optical modulation element, the production of a single-crystalline ferroelectric thin film having a low optical propagation loss and characteristics as a single crystal is indispensable. Therefore, various epitaxial ferroelectric thin films such as $LiNbO_3$, $LiTaO_3$, $KNbO_3$, $BaTiO_3$, $PbTiO_3$, $Pb_{1-x}La_x(Zr_{1-y}Ti_y)_{1-x/4}O_3$(PLZT), and $Bi_4Ti_3O_{12}$ have been formed on single crystal-oxide substrate by a vapor growth method such as an rf-magnetron sputtering method, an ion beam sputtering method, a laser abrasion method and an MOCVD method. However, these methods require extremely expensive equipment as well as having problems in the surface quality of the thin film, control of the composition, and homogeneity, and thus a single-crystalline ferroelectric thin film applicable in the practical use has not been provided so far.

A method for improving the surface quality of a thin film is reported in T. Nozawa: "Growth and Properties of an $LiNbO_3$ film on sapphire with an $LiNbO_3$ buffer layer" Electron. Lett. 23 (1987) 1321, disclosing a method where an amorphous $LiNbO_3$ film of 50 nm in thickness is deposited on a sapphire (0001) substrate ($\alpha$-$Al_2O_3$ substrate) by the rf-sputtering method at room temperature followed by the solid phase epitaxial growth at 500° C. and further, the vapor growth of an $LiNbO_3$ film of about 400 nm by the rf-sputtering method at 500° C. Furthermore, a method where an amorphous $LiTaO_3$ thin film of 100 nm thickness is deposited on a sapphire (0001) substrate by the MOCVD method at 470° C. followed by the solid phase epitaxial growth at 700° C. and further, an amorphous $LiTaO_3$ thin film of 150 nm is deposited by the MOCVD method followed by the solid phase epitaxial growth is reported in A. A. Wernberg, G. H. Braunstein, and H. J. Gysling: "Improved solid phase epitaxial growth of lithium tantalate thin films on sapphire, using a two-step metalorganic chemical-vapor deposition process" Appl. Phys. Lett. 63 (1993) 2649. However, since both methods use the vapor growth, neither can satisfy industrial demands in terms of reproductivity of the composition and homogeneity.

On the other hand, Japanese Patent Application Publication (JP-B) No. 62-27482 discloses a method commonly called the sol-gel method, comprising the steps of applying an organometallic compound, which is advantageous in terms of controlling the chemical composition precisely, lowering the temperature of the process, homogeneity and low equipment cost, followed by heating to obtain a ferroelectric thin film. In general, the method can be used to obtain a ferroelectric thin film of a predetermined thickness by laminating a uniform film thickness of between 50 nm and 200 nm. However, since high temperature sintering can obtain only a polycrystalline thin film with a low density, the physical properties of ferroelectrics based on the polarization can not be sufficiently realized. In addition, the products obtained by the method had too much light scattering caused by large grain boundary and pinholes, so could not be utilized as an optical waveguide or the like in any way.

The present inventor has already found a technology capable of achieving the solid phase epitaxial growth utilizing the sol-gel method. K. Nashimoto and M. J. Cima: "Epitaxial $LiNbO_3$ Films Prepared by a Sol-Gel Process", Matter. Lett. 10, 7, 8 (1991) 348 discloses a method comprising the steps of applying an ethyl alcohol solution of ethoxides of Li and Nb, which are organometallic compounds not hydrolyzed in the sol-gel method, $LiOC_2H_5$ and $Nb(OC_2H_5)_5$, on the sapphire single-crystalline substrate, followed by heating to form the epitaxial growth of a ferroelectric thin film $LiNbO_3$ on a sapphire single-crystalline substrate. Especially, by adding $H_2O$ to an Li[Nb$(OC_2H_5)_6$] precursor solution in ethyl alcohol, the $LiNbO_3$ film was changed from an oriented film (that is, although not all, part of the crystal face is preferentially oriented parallel to the substrate) to a polycrystalline film with an increase of amount of $H_2O$ after sintering. However, sintering an unhydrolyzed precursor without $H_2O$ provides an epitaxial growth of an $LiNbO_3$ film at 400° C. The film density obtained by sintering a polycrystalline film and an oriented film at a high temperature was drastically low due to the grain growth and the pore diameter growth. However, an epitaxial $LiNbO_3$ film had an extremely large sub grain and a high density even after the grain growth compared with the polycrystalline film and the oriented film. In addition, the epitaxial film showed a high refractive index compared with the polycrystalline film and the oriented film, and was substantially transparent, which became opaque after the high temperature grain growth. However, a detailed examination revealed that although the epitaxial $LiNbO_3$ ferroelectric thin film sintered at 400° C. was single-crystalline with a smooth surface, pores of several nms were found in the thin film cross-section observed by a TEM (transmission electron microscope), and thus the density is not sufficiently high and the refractive index is not as good as a single crystal. The epitaxial $LiNbO_3$ ferroelectric thin film sintered at 700° C. was single-crystalline with a smooth surface and had an extremely large sub grain (having grain-like structure but with the orientation of the grains being substantially or completely oriented) compared with the polycrystalline film and the oriented film, having a high density and a refractive index comparatively close to that of a single crystal, the film included a few pores, the surface of the film was not optically smooth, and the transparency of the film was not sufficient.

A report following the above-mentioned method of the present inventors is disclosed in P. G. Clem and D. A Payne: "Control of heteroepitaxy in sol-gel derived LiNbO$_3$ film", Mat. Res. Soc. Symp. Proc. 361 (1995) 179. Clem and Payne indicate a method comprising the steps of applying an ethyl alcohol solution of an Li[Nb(OC$_2$H5)$_6$] precursor to a sapphire single-crystalline substrate and heating to obtain an epitaxial LiNbO$_3$ film. The resulting thin film is evaluated by measuring the X-ray diffraction rocking curve half width, which is a quantitative indicator of the incline of the film crystal face with respect to the direction parallel to the substrate surface. According to the results, the value for an LiNbO$_3$ film on a sapphire (0001) substrate is 1.2°, and the value for an LiNbO$_3$ film on a sapphire (1110) substrate is 1.9°. The thin films are not good compared with a single crystal. Further, the films having a refractive index of only 2.07, which is very small compared with 2.20 to 2.29 of a single crystal, are obtained.

Accordingly, with the above-mentioned solid phase epitaxial method, a thin film comparable to a single crystal has not been obtained yet.

On the other hand, the present inventors disclosed an invention related to a method of preparing an oriented multi-layer ferroelectric film which uses films with different heat treatment temperatures to obtain a transparent oriented ferroelectric film with the optically smooth surface in a Japanese patent Application Laid-Open (JP-A) No. 5-342912. In addition, the present inventors further found that the boiling point of an organic compound at atmospheric pressure corresponding to the organic functional group of an organometallic compound as the precursor or a solvent of a precursor is extremely important for the smoothness of the resultant thin film and in preventing pores. Therefore, the inventors disclosed in JP-A No. 7-78508 that the boiling point is preferably at least 80° C.

However, since the above-mentioned methods do not provide the perfect surface smoothness and crystallization in some ferroelectric materials, the optical propagation loss in a thin film optical waveguide is still large. Therefore further quality improvement particularly for LiNbO$_3$, LiTaO$_3$, and KNbO$_3$ is required.

SUMMARY OF THE INVENTION

An object of the present invention is to provide a production method of a ferroelectric thin film element comprising an epitaxial ferroelectric thin film which is better than conventional methods in terms of stable composition control, optical smoothness of the surface, and a high crystallization, by the use of a solid phase epitaxial growth process where an organometallic compound is applied to a single-crystalline substrate, followed by heating.

Another object of the present invention is to provide a single-crystalline ferroelectric thin film element obtained by the above-mentioned method, applicable to an element having an optical waveguide structure.

The above-mentioned objects can be achieved by a production method of a ferroelectric film element comprising the steps of performing a solid phase epitaxial growth process where an organometallic compound is applied on the single-crystalline substrate and heated to produce a ferroelectric buffer layer having a composition different from a single-crystalline substrate on the single-crystalline substrate with a film thickness of 1 nm to 40 nm, thereafter performing at least once a solid phase epitaxial growth process where an organometallic compound is applied on the ferroelectric buffer layer formed in the above process and heated to form a ferroelectric single layer with a thickness of 10 nm or more, and being thicker than the ferroelectric buffer layer.

In the present invention, particularly, a ferroelectric thin film finally formed by providing a ferroelectric buffer layer with a film thickness of 1 nm to 40 nm becomes a single-crystalline epitaxial crystal to obtain a high quality comparable to a single crystal.

As used herein, "single-crystalline" means both a film formed by a single crystal without defect and one having crystal defect such as twin. The present invention can provide at least a crystal which is identified to have the single crystal orientation toward one direction, that is, with the diffraction intensity of the random orientation face of 1% or less with respect to that of the single oriented face by the θ-2θ X ray diffraction pattern. Furthermore, the present invention can provide a crystal with the X-ray diffraction rocking curve half width, which is a quantitative indicator of the incline of the film crystal face with respect to the direction parallel to the substrate (that is, an indicator of the epitaxial characteristics) of 1.0° or less, and further, 0.5° or less.

On the other hand, a ferroelectric thin film element of the present invention comprises a single layer ferroelectric buffer layer formed by the solid phase epitaxial growth on a single crystal substrate with a film thickness of the ferroelectric buffer layer of 1 nm to 40 nm and with the composition of the ferroelectric buffer layer which is different from that of the single-crystalline substrate, and a single layer or plural layers of a ferroelectric thin film layer on the ferroelectric buffer layer, formed by the solid phase epitaxial growth with a film thickness of one layer of the ferroelectric thin film layer which is thicker than the film thickness of the buffer layer and 10 nm or more. The ferroelectric thin film layer element can have a stably controlled composition, an optically smooth surface, and a high crystallization. The number of the layers merely corresponds to the number of the production processes, and thus it need not be apparent from the outside appearance.

According to the present invention, as mentioned above, a process of forming a certain ferroelectric buffer layer utilizing the solid phase epitaxial growth process where an organometallic compound is applied on a single-crystalline substrate and heated can provide a single-crystalline epitaxial ferroelectric film having a stably controlled composition, an optically smooth surface, and a high crystallization on a wide area at low equipment cost. The ferroelectric film can be utilized as an element having an optical waveguide structure with an industrial quality and a production stability.

BRIEF DESCRIPTION OF THE DRAWINGS

FIG. 4A , FIG. 4B and FIG. 4C are views illustrating a representative example of the process of forming a ferroelectric thin film element.

FIG. 5 is a graph illustrating the film thickness dependency of the X ray rocking curve half width at the (0006)

face of an epitaxial $LiNbO_3$ film buffer layer obtained on a sapphire (0001) single-crystalline substrate.

FIG. 6 is an X-ray diffraction pattern of an epitaxial $LiNbO_3$ film of the present invention obtained on a sapphire (0001) single-crystalline substrate.

Figure 7:
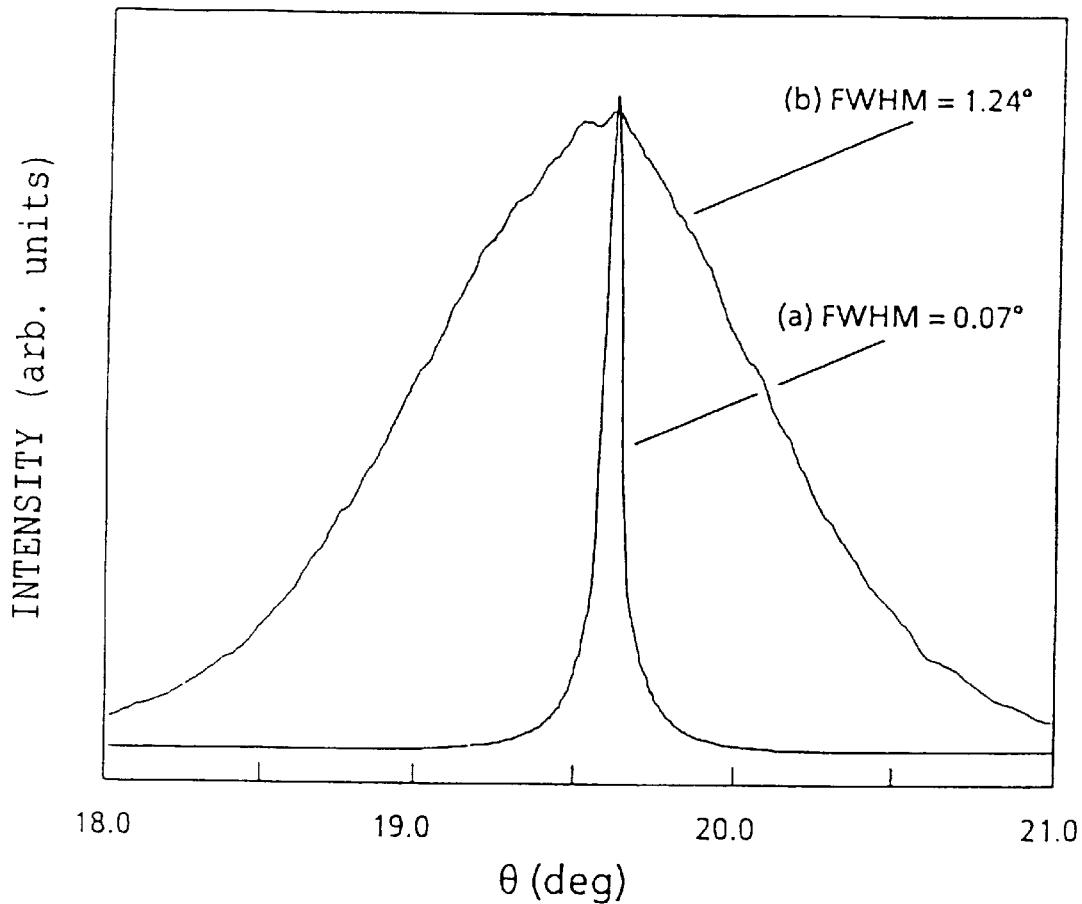

FIG. 7 is an X-ray rocking curve at the (0006) face of an epitaxial $LiNbO_3$ film of the present invention obtained on a sapphire (0001) single-crystalline substrate and an X-ray rocking curve at the (0006) face of an epitaxial $LiNbO_3$ film of a comparative example.

Figure 8:
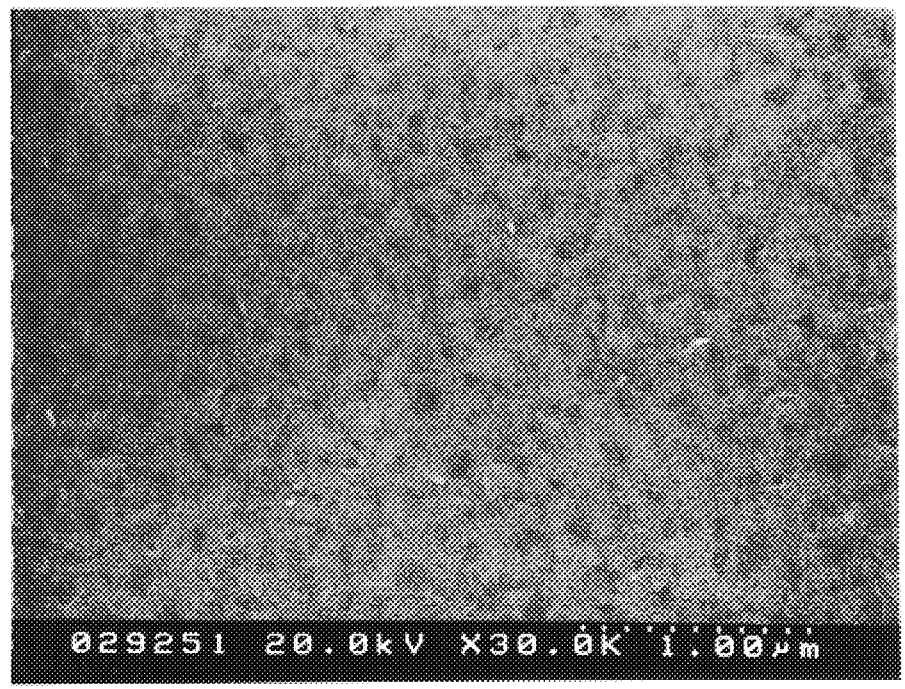

FIG. 8 is a scanning electron microscope photograph of an epitaxial $LiNbO_3$ film of the present invention obtained on a sapphire (0001) single-crystalline substrate.

Figure 9:
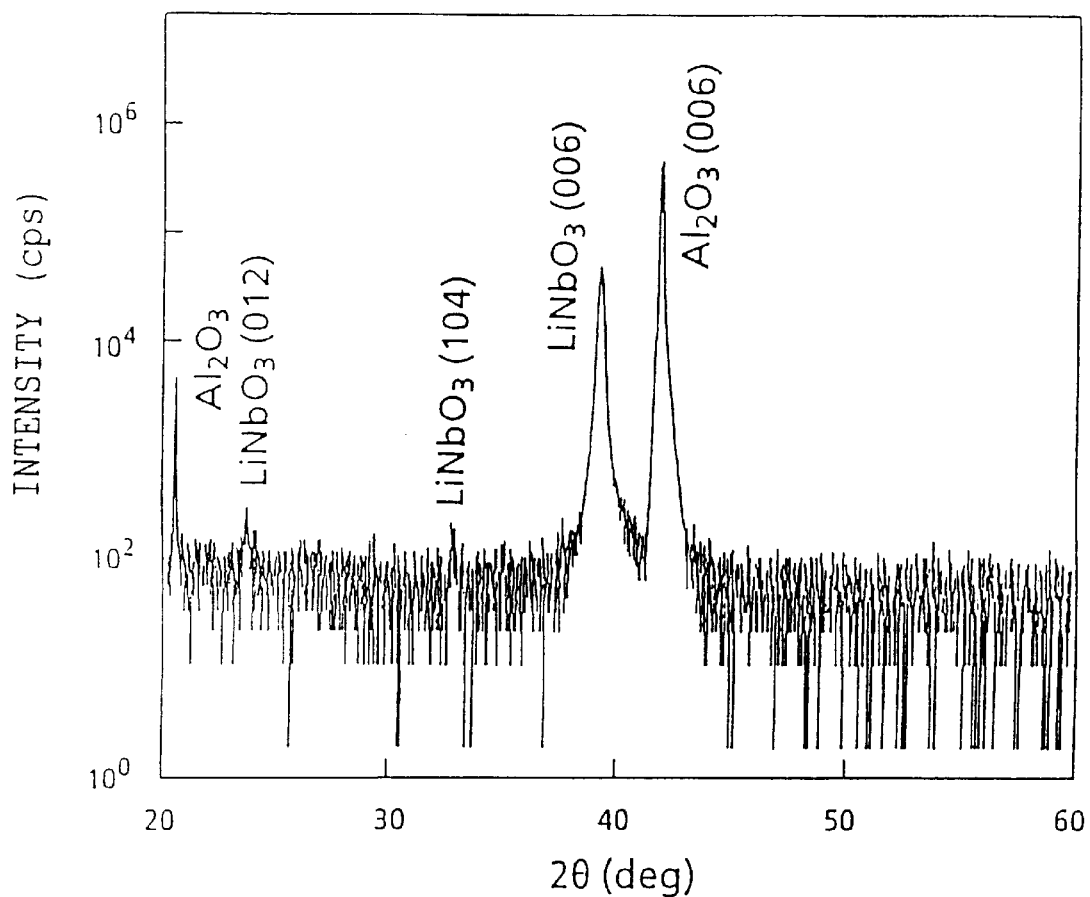

FIG. 9 is an X-ray diffraction pattern of an epitaxial $LiNbO_3$ film of a comparative example obtained on a sapphire (0001) single-crystalline substrate.

Figure 10:
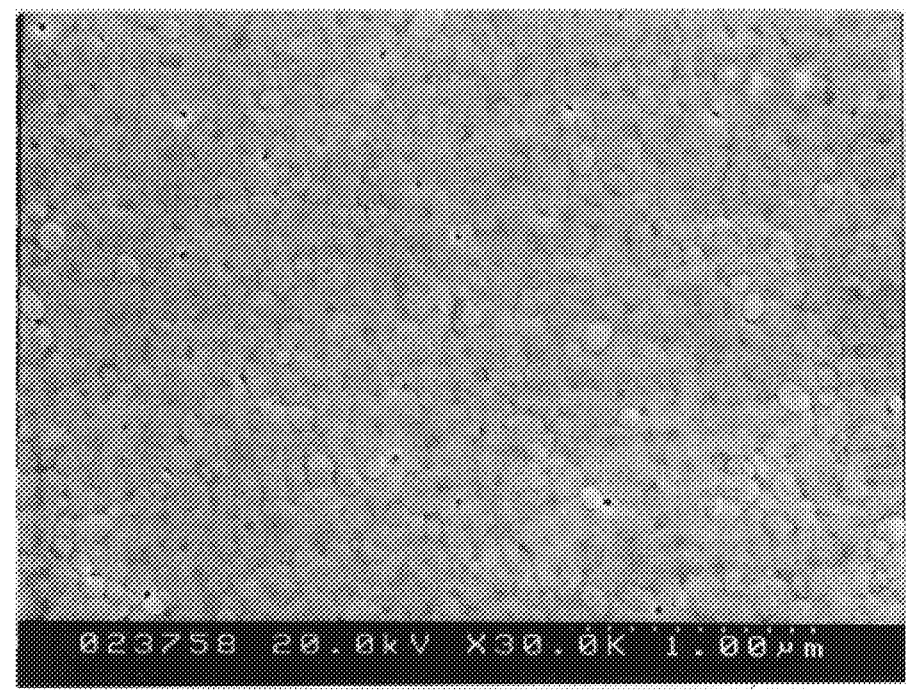

FIG. 10 is a scanning electron microscope photograph of an epitaxial $LiNbO_3$ film of a comparative example.

DESCRIPTION OF THE PREFERRED EMBODIMENTS

The present invention will be described in detail with reference to embodiments.

The method of the present invention may conduct a process of forming a ferroelectric buffer layer having a film thickness of 1 nm to 40 nm on a single-crystalline substrate by the solid phase epitaxial growth process where an organometallic compound is applied on the single-crystalline substrate and heated (buffer layer formation process).

Organometallic compounds used in the buffer layer formation process are selected from reaction products of metals such as Li, K, Nb, Ta, Bi, Ba, Na, Sr, Pb, La, Ti and Zr, preferably metals such as Li, K, Nb, and Ta, and an organic compound, in particular, metal alkoxides and organometalic salts. Since a preferable amorphous film can be obtained by the amorphous process hereinafter, a mixture of a plurality of organometallic compounds selected from metal alkoxides and organometallic salts, or a reaction product of a plurality of organometallic compounds is used as the organometallic compound.

It is preferable to use the above-mentioned organic compound with a boiling point of 80° C. or more at atmospheric pressure. In this case, the smoothness of the resulting thin film is improved and the pore generation can be easily prevented.

The organic ligand of a metal alkoxide compound is generally selected from $R_1O-$ or $R_2OR_3O-$ (wherein $R_1$ and $R_2$ denote an aliphatic hydrocarbon group and $R_3$ denotes a divalent aliphatic hydrocarbon group capable of having an ether bond). As an aliphatic hydrocarbon group of $R_1$ and $R_2$, an alkyl group having 1 to 4 carbon atoms is preferable, and as $R_3$, an alkylene group having 2 to 4 carbon atoms and a divalent group having 4 to 8 total carbon atoms where alkylene groups having 2 to 4 carbon atoms are bonded by the ether bond are preferable.

These materials have a predetermined composition [that is, a composition corresponding to the film composition], and are reacted with or dissolved in a solvent selected from the group consisting of alcohols, diketones, ketonic acids, alkylesters, oxy-acids, oxy-ketones, and acetic acid, then applied to a substrate. As a solvent, $C_2H_5OH$ (boiling point 78.3° C.) can be used. However, having a boiling point of 80° C. or more at atmospheric pressure are preferable, for the same reason as the above-mentioned organic compound. Examples of solvents having a boiling point of 80° C. or more include alcohols, which are capable of easy alcohol substitution reaction of a metal alkoxide, such as $(CH_3)_2CHOH$ (boiling point (bp.) 82.3° C.), $CH_3(C_2H_5)CHOH$ (bp. 99.5° C.), $(CH_3)_2CHCH_2OH$ (bp. 108° C.), $C_4H_9OH$ (bp. 117.7° C.), $(CH_3)_2CHC_2H_4OH$ (bp. 130.5° C.), $CH_3OCH_2CH_2OH$ (bp. 124.5° C.), $C_2H_5OCH_2CH_2OH$ (bp. 135° C.), and $C_4H_9OCH_2CH_2OH$ (bp. 171° C.) as the most preferable ones, but they are not limited thereto.

After hydrolysis of an organometallic compound, the resulting compound can be applied to a substrate. However, in order to obtain an epitaxial ferroelectric thin film, it is preferable not to hydrolyze the organometallic compound. Furthermore, it is preferable to conduct these reaction processes in a dry nitrogen or argon atmosphere with respect to the quality of the thin film to be obtained.

A synthesis of a metal alkoxide compound may include a known method such as substitution of a halogen and an alkoxy group or an alcohol substitution reaction by distillation or reflux of a metal halide or a material metal alkoxide compound in an organic solvent represented by $R_1OH$ or $R_2OR_3OH$.

The single-crystalline substrate used in the present invention is not particularly specified, but an oxide single-crystalline substrate such as $\alpha\text{-}Al_2O_3$, $LiTaO_3$, $MgO$, $MgAl_2O_4$, and $ZnO$ is preferable.

In general, a single-crystalline substrate is used after washing with a solvent, etching, rinsing and drying.

A solvent including an organometallic compound can be applied to the single-crystalline substrate by a method selected from the group consisting of the spin coat method, the dipping method, the spray method, the screen printing method, the ink jet method, and the like. It is preferable to conduct the application process in a dry nitrogen or argon atmosphere with respect to the quality of the resulting film.

The thickness of the applied layer depends on the volume reduction by heating of the organometallic compound, but in general, about 1.1 times to 3.0 times that of the desired film thickness is required.

The solid phase epitaxial growth process including a heating process is conducted after the application process, wherein the applied layer may be heated in conditions allowing the solid phase epitaxial growth (see below) without pretreatment, but it is preferable to have a pretreatment. Pretreatments include (a) to (C) as follows: (a) the amorphous process, (b) the intermediate process, and (C) the amorphous process followed by the intermediate process. In the amorphous process of the pretreatment, a substrate with the applied layer is heated in an oxygen-containing atmosphere, preferably in oxygen, at a heating rate of 0.1 to 1000° C./second, preferably 1° to 100° C./second, and maintained in a temperature range of 100° C. to 500° C., preferably 200° C. to 400° C., without causing crystallization so that thermal degradation of the applied layer causes the layer to become an amorphous film.

Then a substrate provided with the applied layer, preferably a substrate treated with the above-mentioned treatment is applied with the solid phase epitaxial heating process. The epitaxial heating process comprises heating in an oxygen-containing atmosphere, preferably in oxygen, at a heating rate of 0.1° to 1000° C./second, preferably 1° to 100° C./second, and maintained in a temperature range of 300° C. to 1200° C., preferably 400° C. to 900° C. to obtain an epitaxial crystallization, where the amorphous film obtained by the above-mentioned pretreatment is processed to be a ferroelectric film by the solid phase epitaxial growth. In the epitaxial crystallization, maintaining in the above-mentioned temperature from 1 second to 24 hours, preferably from 10 seconds to 12 hours can provide a ferroelectric buffer layer of a film thickness of 1 nm to 40 nm, preferably 2 nm to 20 nm.

In the present invention, it is most necessary to have the thickness of the ferroelectric buffer layer of 40 nm or less, which is important to provide a high quality film. This will be clearly understood from the examples hereinafter. The lower limit of 1 nm is set for the reason that the unit cell of the crystal is substantially 1 nm.

The above-mentioned oxygen-containing atmosphere used upon heating is preferably a dry oxygen atmosphere which may be dried at least for a certain time duration in order to obtain high quality film, but humidification is possible, if necessary.

After the epitaxial growth, in general, cooling is conducted at a cooling rate of 0.01° to 100° C./second.

Figure 1A:
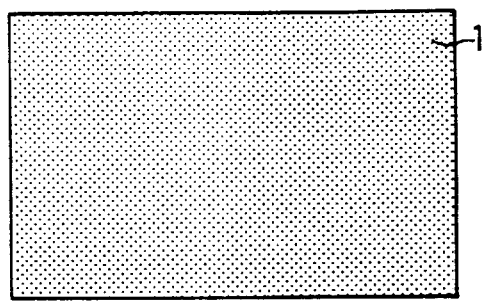
FIG. 1A is a top face view and FIG. 1B is a cross-sectional view of a ferroelectric buffer layer obtained on a single-crystalline substrate with a continuous structure.
Figure 1B:
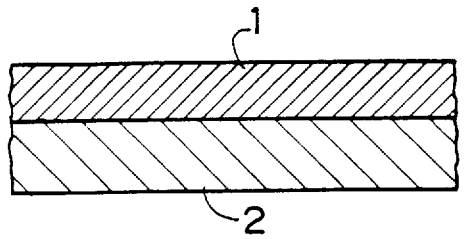
Figure 2A:
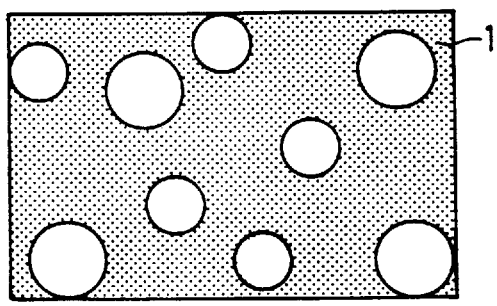
FIG. 2A is a top face view and FIG. 2B is a cross-sectional view of a ferroelectric buffer layer obtained on a single-crystalline substrate with an intermediate structure containing a continuous structure and an island-like structure.
Figure 2B:
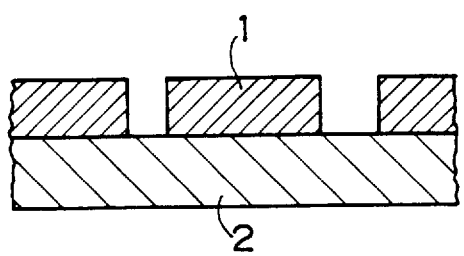
Figure 3A:
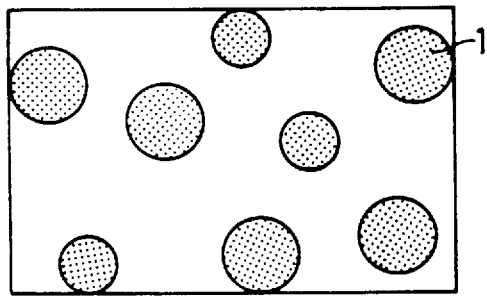
FIG. 3 A is a top face view and FIG. 3B is a cross-sectional view of a ferroelectric buffer layer obtained on a single-crystalline substrate with an island-like structure.
Figure 3B:
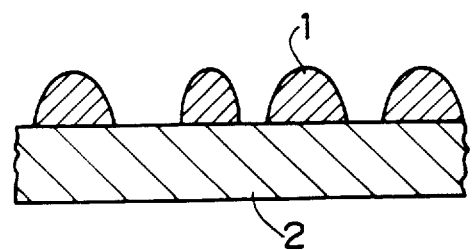

A ferroelectric buffer layer 1 formed as mentioned above is a film formed on a substrate 2 either with a continuous structure as shown in FIG. 1A is a top face view and FIG. 1B is across-sectional view, a film with an intermediate structure between a continuous structure and a discontinuous island-like structure as shown in FIG. 2A and FIG. 2B correspond to FIG. 1A and FIG. 1B, or a film with a discontinuous island-like structure as shown in FIG. 3A and FIG. 3B correspond to FIG. 1A and FIG. 1B. Among these, a film having a discontinuous island-like structure shown in FIG. 3A and FIG. 3B are advantageous in terms of the quality improvement of the resultant film for the reason hereinafter given. These differences of the structure can be controlled by the heating conditions. For example, in the case of preparing an $LiNbO_3$ film, the steps of heating a spin coated substrate in a dry $O_2$ atmosphere having a dew point of −60° C. at a rate of 20° C./sec and maintained at 300° C., and then maintained at 700° C. for 5 minutes can provide the continuous structure shown in FIG. 1A and FIG. 1B. When maintained at 700° C. for a further 30 minutes, an intermediate structure between a continuous structure and a discontinuous island-like structure as shown in FIG. 2A and FIG. 2B can be obtained. When maintaining at 700° C. for a further 90 minutes, a discontinuous island-like structure shown in FIG. 3A and FIG. 3B can be obtained. The structural change is considered to depend on gradual changes from a continuous structure to an island-like structure, which is a stable structure in terms of the surface energy, with time. Although film changes from continuous to a discontinuous island-like structure via an intermediate structure, the film thickness is defined as thickness (T) at the initial continuous structure. The thickness can be determined with a transmission electron microscope or a scanning electron microscope to observe the cross-section of the film, and with an interatomic force microscope to measure the gap between the length of the portion having the film and that of the substrate portion without the film. If it is necessary to determine the thickness of the film having a discontinuous island-like structure directly, it is also effective to define the film thickness by the Rms value of a surface coarseness measurable with an interatomic force microscope. If the T value is different from the Rms value, the T value is given priority.

In the method of the present invention, a ferroelectric thin film layer is formed on the ferroelectric buffer layer by performing at least once the solid phase epitaxial growth process where an organometallic compound is applied on the layer formed in the former process and heated to form a ferroelectric single layer thin film having a thickness of 10 nm or more and being thicker than that of the ferroelectric buffer layer.

The thickness of the ferroelectric single layer film is, in general, 1000 nm or less, preferably 50 nm to 200 nm. The film thickness of the ferroelectric thin film finally formed (single layer or plural layers) is, in general, 5000 nm or less, preferably from 50 nm to 2000 nm.

For the ferroelectric thin film formation process, the same materials, methods (application and heating of an organometallic compound), conditions (heating time, heating temperature, heating rate, cooling rate, atmosphere, etc.), preferable embodiments (such as implementation of a pretreatment) as in the buffer layer formation process can be used or applied. However, the film thickness of a ferroelectric film needs to be thicker than the buffer layer, so the thickness of the applied layer of the organometallic compound should be increased. As a method therefor, it is effective to increase the concentration of the organometallic compound in the solution or to facilitate the application speed. The heating time and the heating temperature, etc. can be the same as the buffer layer formation process or can be appropriately changed within the range of the conditions mentioned above (such as lowering the heating temperature and prolonging the heating time). This would be more specifically and easily understood by a person skilled in the art with reference to the disclosure in the examples.

The composition of the ferroelectric buffer layer and the composition of the ferroelectric thin film layer do not necessarily have to be the same. It is possible to use different compositions depending upon the structures of the thin film optical waveguide element and the ferroelectric composition. When forming the ferroelectric single layer thin film more than once, the composition of the layers is, in general, the same, but it is also possible to use different compositions depending upon the structure of the thin film waveguide element or the ferroelectric composition.

In the present invention, both the ferroelectric buffer layer formation process and the ferroelectric thin film layer formation process includes a heating process. As mentioned above, the solid phase epitaxial growth process can be conducted as the heating process after a pretreatment selected from the group consisting of (a) the amorphous process, (b) the intermediate process, and (c) the above-mentioned amorphous process followed by the intermediate process.

The intermediate process(b)can be used between the amorphous process(a)comprising a step of heating in the temperature range of 100° C. to 500° C. (preferably 200° C. to 400° C.) to thermally decompose the applied layer and to form an amorphous film, and the solid phase epitaxial growth process comprising a step of heating in the temperature range of 300° C. to 1200° C. (preferably 400° C. to 900° C.) to provide the solid phase epitaxial growth of the ferroelectric film. The intermediate process (b) comprises a step of conducting the intermediate heating at 300° C. to 900° C., preferably 300° C. to 600° C., this temperature being lower than the homogeneous nucleus generation temperature of the random crystal nucleus in the ferroelectric film (a temperature at which the nucleus is generated inside the thin film) and higher than the heterogeneous nucleus generation temperature of the epitaxial crystal (a temperature at which the epitaxial crystal nucleus is formed on the substrate surface or the ferroelectric thin film buffer layer surface). The process (c) is an effective way to obtain a film having a higher quality, since the process (c) might prevent too rapid a crystal growth and facilitate the crystal growth in the horizontal direction of the substrate. In the present invention, it is also possible to conduct the intermediate process (b), followed by the solid phase epitaxial growth process without the amorphous process, that is, the solid phase epitaxial growth process can be conducted after the (b) intermediate process.

For the time of the intermediate process, the same conditions as disclosed for the buffer layer formation process can be used or applied.

Representative examples of the processes for forming a ferroelectric thin film layer utilizing the structures of the buffer layers of FIG. 1A to FIG. 3B are shown in FIG. 4A, FIG. 4B, and FIG. 4C schematically. As shown in FIG. 1A to FIG. 2B, in the case a buffer layer 1 is utilized, depending on the surface shape, it is liable to form pores 4 at the time of depositing a ferroelectric thin film layer 3B (having a composition different from the buffer layer 1 in this embodiment) via an amorphous layer 3A. In addition, crystals are liable to grow in the direction perpendicular to the substrate in the epitaxial growth process so as to form pin holes 5. On the other hand, in the case of FIG. 3A and FIG. 3B, pores are not liable to generate at the time of depositing the ferroelectric film layer 3 owing to the island form of the buffer layer 1 and the pitch of the islands. In addition, the crystals are liable to grow in the horizontal direction of the substrate from the island-like buffer layer, and consequently pin holes are less liable to form.

The above-mentioned methods are used to produce a ferroelectric film element. The ferroelectric film element comprises a certain ferroelectric buffer (of a single layer with a film thickness of 1 nm to 40 nm obtained by the solid phase epitaxial growth) provided on a single-crystalline substrate having a composition different from the ferroelectric buffer layer, and a certain ferroelectric thin film layer (of a single layer or a plurality of layers of a ferroelectric thin film layer with a film thickness of one layer of 10 nm or more, being thicker than the film thickness of the ferroelectric buffer layer obtained by the solid phase epitaxial growth) provided on the ferroelectric buffer layer. The ferroelectric thin film is a single-crystalline thin film having similar characteristics to a single crystal with respect to the density and the refractive index, and an optically smooth surface. In particular, it is a single-crystalline ferroelectric oxide thin film such as a film of $BaTiO_3$, $PbTiO_3$, $Pb(Zr_{1-x}Ti_x)O_3$ (PZT), $Pb_{1-x}La_x(Zr_{1-y}Ti_y)_{1-x/4}O_3$(PLZT), $Bi_4Ti_3O_{12}$, $LiNbO_3$, $LiTaO_3$, $KNbO_3$, $Pb(Mg_{1/3}Nb_{2/3})O_3$, $(Sr_{1-x}Ba_x)Nb_2O_6$, $(Pb_{1-x}K_x)Nb_2O_6$, $Ba_2NaNb_5O_{15}$, $Pb_2KNb_5O_{15}$, or $K_3Li_2Nb_5O_{15}$.

In the method of the present invention, particularly a single-crystalline ferroelectric thin film represented by a chemical formula $ABO_3$ can be most effectively produced. In the formula, the element A contains at least Li, K, or Li and K, and the element B contains Nb, Ta, or Nb and Ta. That means $(Li_xK_yQ_{1-x-y})(Nb_hTa_iR_{1-h-i})O_3$ [wherein Q, R denote another metal, $0 \leq x+y \leq 1$ (x, y do not become 0 at the same time), $0 \leq h+i \leq 1$ (h, i do not become 0 at the same time)]. Specific examples of particularly effective structures of combinations of a film and a substrate include $LiNbO_3$(0001)//$Al_2O_3$(0001), $LiNbO_3$(1120)//$Al_2O_3$(1120), $LiNbO_3$(0001)//$LiTaO_3$(0001), $LiNbO_3$(0001)//MgO(111), $LiNbO_3$(0001)// $MgAl_2O_4$(111), $LiNbO_3$(0001)//ZnO(001), $LiNbO_3$(0001)//Al doped ZnO(001), $LiTaO_3$(0001)//$Al_2O_3$(0001), $LiTaO_3$(1120)//$Al_2O_3$(1120), $LiTaO_3$(0001)//MgO (111), $LiTaO_3$(0001)//$MgAl_2O_4$(111), $LiTaO_3$(0001)//ZnO (001), $LiTaO_3$(0001)//Al doped ZnO(001), $KNbO_3$(111)// $Al_2O_3$(0001), $KNbO_3$(100)//MgO(100), $KNbO_3$(111)//MgO (111), $KNbO_3$(111)//ZnO(001), $KNbO_3$(111)//Al doped ZnO(001), but are not limited thereto.

Representative examples of the present invention have been heretofore described. Another embodiment of the production method of the ferroelectric oxide film element of the present invention will be described as follows: A method comprising the steps of: a first solid phase epitaxial growth process where a first organometallic compound is applied on the single-crystalline substrate and heated to form a first ferroelectric buffer layer having a film thickness of 1 nm to 40 nm on a single-crystalline substrate, which is of different composition to the substrate, at least once a second solid phase epitaxial growth where a second organometallic compound is applied on the layer formed on the former process and heated to form a second or later ferroelectric buffer layer having a film thickness of 1 nm to 40 nm on the single-crystalline substrate, and at least once a third solid phase epitaxial growth where a third organometallic compound is applied on the layer formed in the former process and heated to form a ferroelectric film layer having a thickness of 10 nm or more, being thicker than the ferroelectric buffer layers on the ferroelectric buffer layer. In this embodiment, a ferroelectric film element is produced which comprises a plurality of ferroelectric buffer layers each having a thickness of 1 nm to 40 nm obtained by the first solid phase epitaxial growth process are provided on a single-crystalline substrate having a composition different from the ferroelectric buffer layer, and a ferroelectric thin film layer of a single layer or plural layers each having a film thickness of 10 nm or more, being thicker than the buffer layer obtained by the second solid phase epitaxial growth is provided on the ferroelectric buffer layer is produced. The description for the above-mentioned embodiment is fully applied to the above-mentioned method and the resulting ferroelectric thin film element.

As shown in Table 1, the production method of single-crystalline ferroelectric thin film by the solid phase epitaxial growth of the present invention described above is superior to the conventional vapor phase epitaxial growth thereby, the conventional solid phase epitaxial growth thereby using the vapor phase growth film, and the conventional sol-gel method, in particular, in terms of the epitaxial growth, the surface smoothness, the composition control, the film thickness homogeneity, the equipment cost, and the like.

TABLE 1

Comparison of epitaxial growth methods of ferroelectric thin films

| Growing method | Epitaxial growth | Smoothness | Composition control | Homogeneity | Equipment cost |
|---|---|---|---|---|---|
| Rf sputtering | ○ | Δ | × | Δ | Δ |
| Ion beam sputtering | ○ | Δ | ○ | × | × |
| Laser deposition | ○ | Δ | Δ | × | Δ |
| Electron beam deposition | Δ | × | × | Δ | Δ |
| MOCVD | Δ | Δ | ○ | ○ | × |

TABLE 1-continued

Comparison of epitaxial growth methods of ferroelectric thin films

| Growing method | Epitaxial growth | Smoothness | Composition control | Homogeneity | Equipment cost |
|---|---|---|---|---|---|
| Solid phase epitaxial growth using a vapor phase growth | Δ | ○ | ○ | ○ | × |
| Sol-gel method | Δ | Δ | ⊚ | ⊚ | ⊚ |
| Sol-gel solid phase epitaxial growth of the present invention | ○ | ⊚ | ⊚ | ⊚ | ⊚ |

EXAMPLE

Example 1

(utilizing an island-like ferroelectric buffer layer)

$LiOC_2H_5$ (99.9%) and $Nb(OC_2H_5)_5$ (99.999%) of the equivalent molar amount were dissolved in 2-methoxyethanol ($CH_3OC_2H_4OH$) dehydrated with molecular sieve having a boiling point at atmospheric pressure of 124.5° C. to obtain solutions of 0.06M and 0.6M. After a two hour distillation at 124.5° C. while stirring, followed by reflux for 22 hours, double alkoxide $Li[Nb(OC_2H_4OCH_3)_6]$ was obtained. The alcohol substitution reaction was confirmed by the $^1H$ NMR spectrum.

Then the 0.06M solution was filtrated through a filter of 0.2 μm and spin coated on a sapphire (0001) single-crystalline substrate ($\alpha$-$Al_2O_3$(0001)) at 2,000 rpm. The above-mentioned operation was conducted in an $N_2$ atmosphere. Before the spin coating, the sapphire substrate was washed with a solvent, etched by HCl, rinsed with deionized water, and finally dried by spin coating with ethanol in $N_2$.

The spin coated substrate was heated at the heating rate of 20° C./sec in a dry $O_2$ atmosphere having a dew point of −60° C., maintained at 300° C. to form an amorphous film, then maintained at 700° C. for 90 minutes, and finally cooled by switching off the power source of the electric furnace. It was observed by a high resolution SEM (scanning electron microscope) and X-ray diffraction that an $LiNbO_3$ film buffer layer of the film thickness of about 10 nm having an island-like structure as shown in FIG. 3A and FIG. 3B were formed by the solid phase epitaxial growth. The X-ray diffraction rocking curve half width was only 0.07°.

The X-ray rocking curve half widths of the $LiNbO_3$ films having different film thicknesses obtained by spin coating the above-mentioned double alkoxide solutions with concentrations from 0.03M to 0.6M on a substrate, heating the substrate at the rate of 20° C./sec in a dry $O_2$ atmosphere having a dew point of −60° C., maintained at 300° C. to form an amorphous film, maintained at 700° C. for 30 minutes are shown in FIG. 5. As apparent from FIG. 5, the X-ray diffraction rocking curve half width drastically drops at the point of the film thickness of 40 nm. Accordingly, it is extremely effective to use a buffer layer of 40 nm or less in a solid phase epitaxial growth process on a single-crystalline substrate by heating an organometallic compound to crystallize.

The above-mentioned double alkoxide 0.6M solution was filtrated through a filter of 0.2 μm and spin coated at 2000 rpm on a sapphire (0001) single-crystalline substrate having an $LiNbO_3$ film buffer layer of a film thickness of about 10 nm in an $N_2$ atmosphere. The spin coated substrate was heated at the rate of 20° C./sec in a dry $O_2$ atmosphere having a dew point of −60° C., maintained at 300° C. to form an amorphous film, then maintained at 700° C. for 30 minutes, and cooled at the rate of 20° C./min. Accordingly, an $LiNbO_3$ film having a film thickness of about 100 nm was formed by the solid phase epitaxial growth, and consequently an epitaxial $LiNbO_3$ film of a total film thickness of about 110 nm was obtained.

As shown in FIG. 6, the X-ray diffraction pattern of the epitaxially crystallized $LiNbO_3$ film completely indicates only the (0006) diffraction peak at the (0001) face. A further analysis by the X-ray diffraction pole figure revealed that the crystal orientations of the sapphire and $LiNbO_3$ in the substrate surface were identical. The X-ray diffraction rocking curve half width of the obtained epitaxial $LiNbO_3$ film at the (0006) face was, as shown by curve 6 of FIG. 7, only 0.07°, which is substantially equal to the $LiNbO_3$ film buffer layer. Accordingly, a remarkably good figure of substantially the same as the rocking curve half width of the substrate was obtained in the measuring conditions, that is, the crystalline quality of the $LiNbO_3$ film buffer layer was transferred to the $LiNbO_3$ film provided above.

The surface of the epitaxial $LiNbO_3$ film according to Example 1 was observed with a high resolution SEM. It was found that the surface was an extremely smooth mirror-like one so as not to obtain contrast without a grain boundary or a pore as shown in FIG. 8. Therefore the Rms surface coarseness of the epitaxial $LiNbO_3$ film was defined with an interatomic force microscope (AFM) to be merely 2.3 nm. The refractive index of the epitaxial $LiNbO_3$ film according to Example 1 measured with an ellipsometre was 2.24, which is substantially the same as that of a single crystal (refractive index is 2.20 to 2.29).

To evaluate the optical waveguide characteristics of the epitaxial $LiNbO_3$ film according to Example 1, a laser light of 632.8 nm was introduced to the thin film through prism coupling, and the scattering light intensity distribution of the TE0 mode in the optical propagation direction was measured with optical fibers. The optical propagation loss was sought by the inclination of the relationship between the logarithm of the scattering light intensity and the optical propagation distance and found to be about 1 dB/cm, which is an excellent characteristic comparable to that of a Ti diffusion type optical waveguide or a proton ion exchange type optical waveguide formed on an $LiNbO_3$ single-crystalline wafer.

As heretofore mentioned, the crystal quality of the $LiNbO_3$ film buffer layer is extremely important. An epitaxial $LiNbO_3$ film according to this embodiment is very close to single crystal, and thus it is a single-crystalline $LiNbO_3$ film applicable as an excellent optical waveguide. The inventors believed that the lattice defect due to the lattice unconformity between $LiNbO_3$ and sapphire is finished to some extent in the solid phase epitaxial growth in the $LiNbO_3$ film buffer layer and thus in the $LiNbO_3$ film formed by the solid phase epitaxial growth thereon, the lattice defect is prevented compared with the $LiNbO_3$ film formed by the solid phase epitaxial growth directly on the sapphire single-crystalline substrate, such a thin film that could be obtained. In addition, it is considered that according to the preferable embodiment where the $LiNbO_3$ film buffer layer has an island-like structure, the two-dimensional crystals significantly grow in the direction parallel to the substrate surface with the buffer layer as the nucleus, so as to provide the preferable smoothness of surface.

Comparative Example 1
(without a ferroelectric buffer layer)

As in Example 1, $LiOC_2H_5$ (99.9%) and $Nb(OC_2H_5)_5$ (99.999%) of the equivalent molar amount were dissolved in 2-methoxyethanol ($CH_3OC_2H_4OH$) (dehydrated with a molecular sieve) having a boiling point at atmospheric pressure of 124.5° C. to obtain a solution of 0.60M. After a two hour distillation at 124.5° C. while stirring, followed by reflux for 22 hours, double alkoxide $Li[Nb(OC_2H_4OCH_3)_6]$ was obtained. Then the 0.60M solution was filtrated through a filter of 0.2 $\mu$m and spin coated at 2000 rpm on a sapphire (0001) single-crystalline substrate (0001). The above-mentioned operation was conducted in an $N_2$ atmosphere. Before the spin coating, the sapphire substrate was washed with a solvent, etched by HCl, rinsed with deionized water, and finally dried by spin coating with ethanol in $N_2$.

The spin coated substrate was heated at the rate of 20° C./sec in a dry $O_2$ atmosphere having a dew point of −60° C., maintained at 300° C., and further maintained at 700° C. for 30 minutes, and finally cooled at the rate of 20° C./min. Accordingly, an $LiNbO_3$ film having a film thickness of about 100 nm was formed by the solid phase epitaxial growth.

As shown in FIG. 9, the X-ray diffraction pattern of the epitaxially crystallized $LiNbO_3$ film substantially indicates only the (0006) diffraction peak at the (0001) face, but a slight diffraction peak was found in the (0112) face, which was misoriented, and thus the (0006) diffraction peak intensity was about 20% with respect to that of Example 1. The X-ray diffraction rocking curve half width FWHM of the obtained epitaxial $LiNbO_3$ film at the (0006) face was, as shown by curve 7 of FIG. 7, 1.24°, which value is worse than that of Example 1 (0.07°) by more than one digit.

The surface of the epitaxial $LiNbO_3$ film of Comparative Example 1 was observed with a high resolution SEM, and it was found that the surface was extremely rugged with grain boundaries and pores caused by the misoriented (0112) face as shown in FIG. 10. Therefore the optical propagation loss as an optical waveguide characteristic was extremely large and thus it is impossible to use it as an optical waveguide.

Comparative Example 2
(with a ferroelectric buffer layer film thickness exceeding the limit)

As in Example 1, $LiOC_2H_5$ (99.9%) and $Nb(OC_2H_5)_5$ (99.999%) of the equivalent molar amount were dissolved in 2-methoxyethanol ($CH_3OC_2H_4OH$) dehydrated with a molecular sieve having a boiling point at atmospheric pressure of 124.5° C. to obtain solutions of 0.36M and 0.60M. After a two hour distillation at 124.5° C. with stirring of the solutions, followed by and further reflux for 22 hours, double alkoxide $Li[Nb(OC_2H_4OCH_3)_6]$ was obtained. Then the 0.36 solution was filtered through a filter of 0.2 $\mu$m and spin coated at 2000 rpm on a sapphire (0001) single ($\alpha$-$Al_2O_3$(0001)) crystalline substrate (0001). The above-mentioned operation was conducted in an $N_2$ atmosphere. Before the spin coating, the sapphire substrate was washed with a solvent, etched by HCl, rinsed with deionized water, and finally dried by spin coating with ethanol in $N_2$.

The spin coated substrate was heated at the rate of 20° C./sec in a dry $O_2$ atmosphere having a dew point of −60° C., maintained at 300° C., then maintained at 700° C. for 90 minutes, and finally cooled by switching off the power source of the electric furnace. Accordingly, an $LiNbO_3$ film buffer layer having a film thickness of about 60 nm and an X-ray diffraction rocking curve half width of 0.85° was formed by solid phase epitaxial growth.

The above-mentioned double alkoxide 0.60M solution was filtrated through a filter of 0.2 $\mu$m and spin coated at 2000 rpm on a sapphire (0001) single-crystalline substrate having an $LiNbO_3$ film buffer layer of a film thickness of about 60 nm in an $N_2$ atmosphere. The spin coated substrate was heated at the rate of 20° C./sec in a dry $O_2$ atmosphere having a dew point of −60° C., maintained at 300° C., then maintained at 700° C. for 30 minutes, and cooled at the rate of 20° C./min. Accordingly, an $LiNbO_3$ film having a film thickness of about 100 nm was formed by the solid phase epitaxial growth, and consequently an epitaxial $LiNbO_3$ film of a total film thickness of about 160 nm was obtained.

The X-ray diffraction pattern of the epitaxially crystallized $LiNbO_3$ film substantially indicates only the (0006) diffraction peak at the (0001) face, but a slight diffraction peak was found in the (0112) face, which was misoriented. The X-ray diffraction rocking curve half width FWHM of the obtained epitaxial $LiNbO_3$ film at the (0006) face was 1.03°, which value is worse than that of the $LiNbO_3$ film of Example 1 (0.07°) by one digit.

The surface of the epitaxial $LiNbO_3$ film of Comparative Example 2 was observed with a high resolution SEM and it was found that the surface was extremely rugged with grain boundaries and pores.

Example 2
(utilizing a comparatively continuous ferroelectric buffer layer)

As in Example 1, a 0.06M solution of double alkoxide $Li[Nb(OC_2H_4OCH_3)_6]$ was filtrated through a filter of 0.2 $\mu$m and spin coated at 2000 rpm on a sapphire (0001) single-crystalline substrate. The above-mentioned operation was conducted in an $N_2$ atmosphere. Before the spin coating, the sapphire substrate was washed with a solvent, etched by HCl, rinsed with deionized water, and finally dried by spin coating with ethanol in $N_2$.

The spin coated substrate was heated at the rate of 20° C./sec in a dry $O_2$ atmosphere having a dew point of −60° C., maintained at 300° C. to form an amorphous film, then maintained at 700° C. for 5 minutes, and finally cooled by switching off the power source of the electric furnace. Accordingly, an $LiNbO_3$ film having a film thickness of about 10 nm was formed by the solid phase epitaxial growth. Accordingly, an $LiNbO_3$ film buffer layer having a film thickness of about 10 nm having a continuous structure shown in FIG. 1A and FIG. 1B with the X-ray diffraction rocking curve half width FWHM of only 0.09° was produced.

The above-mentioned double alkoxide 0.6M solution was filtrated through a filter of 0.2 $\mu$m and spin coated at 2000 rpm on a sapphire (0001) single-crystalline substrate having an $LiNbO_3$ film buffer layer in an $N_2$ atmosphere. The spin coated substrate was heated at the rate of 20° C./sec in a dry $O_2$ atmosphere having a dew point of −60° C., maintained at 300° C. to form an amorphous film, then maintained at 400° C. for 30 minutes to perform the above-mentioned intermediate process, and finally cooled at the rate of 20° C./min. Accordingly, an $LiNbO_3$ film having a film thickness of about 100 nm was formed by solid phase epitaxial growth. After repeating the operation another three times, the spin coated substrate was finally heated at the rate of 20° C./sec in a dry $O_2$ atmosphere having a dew point of -60° C., maintained at 300° C. to form an amorphous film, then maintained at 400° C. for 30 minutes to perform the above-mentioned intermediate process, further maintained at 700° C. for 90 minutes and cooled at the rate of 30° C./min. Accordingly, an $LiNbO_3$ film having a film thickness of about 500 nm was formed by solid phase epitaxial growth to obtain an epitaxial $LiNbO_3$ film having a total film thickness of about 510 nm.

The X-ray diffraction pattern of the epitaxially crystallized $LiNbO_3$ film indicates only the diffraction peak at the (0001) face as in Example 1. The X-ray diffraction rocking curve half width FWHM of the resulting epitaxial $LiNbO_3$ film at the (0006) face was 0.19°, which value is much better than that of Comparative Example 1. The surface of the epitaxial $LiNbO_3$ film of Example 2 was observed with a high resolution SEM. It was found that the surface was smooth without a grain boundary or pores.

Example 3
(alteration in the substrate orientation)

As in Example 1, a 0.03M solution of double alkoxide $Li[Nb(OC_2H_4OCH_3)_6]$ was filtrated through a filter of 0.2 μm and spin coated at 2000 rpm on a sapphire (1120) single-crystalline substrate. The above-mentioned operation was conducted in an $N_2$ atmosphere. Before the spin coating, the sapphire substrate was washed with a solvent, etched by HCl, rinsed with deionized water, and finally dried by spin coating with ethanol in $N_2$.

The spin coated substrate was heated at the rate of 50° C./sec in an $O_2$ atmosphere with bubbling in deionized water at 1.0 L/min at room temperature, maintained at 350° C. to form an amorphous film, then maintained at 700° C. for 30 minutes, and finally cooled by switching off the power source of the electric furnace. Accordingly, an $LiNbO_3$ filmbuffer layer having a film thickness of about 5 nm with the intermediate structure as shown in FIG. 2A and FIG. 2B were formed by the solid phase epitaxial growth. The X-ray diffraction rocking curve half width of the resulting $LiNbO_3$ film buffer layer was only 0.08°.

The above-mentioned 0.6M solution of double alkoxide was filtrated through a filter of 0.2 μm and spin coated at 2000 rpm on a sapphire (1120) single-crystalline substrate in an $N_2$ atmosphere. The spin coated substrate was heated at the rate of 50° C./sec in an $O_2$ atmosphere with bubbling in deionized water at 1.0 L/min at room temperature, maintained at 350° C. to form an amorphous film, then maintained at 500° C. for 90 minutes, and cooled at the rate of 20° C./min. Accordingly, an $LiNbO_3$ film buffer layer having a film thickness of about 100 nm was formed by the solid phase epitaxial growth. By repeating the operation again twice, an $LiNbO_3$ film having a film thickness of about 300 nm was formed by solid phase epitaxial growth to obtain an epitaxial $LiNbO_3$ film having a total film thickness of about 305 nm.

The X-ray diffraction pattern of the epitaxially crystallized $LiNbO_3$ film indicates only the diffraction peak at the (1120) face completely. A further analysis by the pole figure revealed that the crystal orientations of the sapphire and $LiNbO_3$ in the substrate surface were identical. The X-ray diffraction rocking curve half width FWHM of the obtained epitaxial $LiNbO_3$ film at the (1120) face was good, having a value of only 0.30°. The surface of the epitaxial $LiNbO_3$ film of the present example was observed with a high resolution SEM. It was found that the surface was smooth without a grain boundary or pores.

Example 4
(alteration in the ferroelectric buffer layer film thickness, utilizing an intermediate structure ferroelectric buffer layer)

$LiOC_2H_5$ (99.9%) and $Nb(OC_2H_5)_5$ (99.999%) of the equivalent molar amount were dissolved in ethanol ($C_2H_5OH$) dehydrated with a molecular sieve to obtain solutions of 0.10M and 0.60M. After reflux for 24 hours, double alkoxide $Li[Nb(OC_2H_5)_6]$ was obtained. Then the 0.10M solution was filtrated through a filter of 0.2 μm and spin coated at 2000 rpm on a sapphire (1120) single-crystalline substrate. The above-mentioned operation was conducted in an $N_2$ atmosphere. Before the spin coating, the sapphire substrate was washed with a solvent, etched by HCl, rinsed with deionized water, and finally dried by spin coating with ethanol in $N_2$.

The spin coated substrate was heated at a rate of 20° C./sec in an $O_2$ atmosphere with bubbling in deionized water by 1.0 L/min at room temperature, maintained at 300° C. to form an amorphous film, then maintained at 700° C. for 30 minutes, and finally cooled by switching off the power source of the electric furnace. Accordingly, an $LiNbO_3$ film buffer layer having a film thickness of about 20 nm was formed by the solid phase epitaxial growth. That is, an $LiNbO_3$ film buffer layer having a film thickness of about 20 nm with an intermediate structure shown in FIG. 2A and FIG. 2B were formed by the solid phase epitaxial growth. The X-ray diffraction rocking curve half width of the resulting $LiNbO_3$ film buffer layer was only 0.08°.

The above-mentioned 0.60M solution of double alkoxide was filtrated through a filter of 0.2 μm and spin coated at 2000 rpm on a sapphire (1120) single-crystalline substrate having an $LiNbO_3$ film buffer layer in an $N_2$ atmosphere. The spin coated substrate was heated at a rate of 2° C./sec in an $O_2$ atmosphere by bubbling in deionized water at 1.0 L/min at room temperature, maintained at 300° C. to form an amorphous film, then maintained at 700° C. for 30 minutes, and cooled at the rate of 30° C./min. Accordingly, an $LiNbO_3$ film having a film thickness of about 100 nm was formed by the solid phase epitaxial growth. By repeating the operation another four times, an $LiNbO_3$ film having a film thickness of about 500 nm was formed by solid phase epitaxial growth to obtain an epitaxial $LiNbO_3$ film having a total film thickness of about 520 nm.

The X-ray diffraction pattern of the epitaxially crystallized $LiNbO_3$ film indicates only the diffraction peak at the (1120) face completely as in the above example. The X-ray diffraction rocking curve half width FWHM of the obtained epitaxial $LiNbO_3$ film at the (1120) face was good, having a value of 0.28°. The surface of the epitaxial $LiNbO_3$ film of the present example was observed with a high resolution SEM. It was found that the surface was smooth without a grain boundary or pores.

Example 5
(alteration of the substrate)

As in the above examples, a 0.03M solution of double alkoxide $Li[Nb(OC_2H_4OCH_3)_6]$ was filtrated through a filter of 0.2 μm and spin coated at 2000 rpm on an MgO single-crystalline substrate (111). The above-mentioned operation was conducted in an $N_2$ atmosphere. Before the spin coating, the MgO substrate was washed with a solvent, etched by HCl, rinsed with deionized water, dried by spin coating with ethanol in $N_2$, and finally annealed at a high temperature in an $O_2$ atmosphere.

The spin coated substrate was heated at the rate of 10° C./sec in a dry $O_2$ atmosphere having a dew point of -60° C., maintained at 300° C. to form an amorphous film, then maintained at 700° C. for 90 minutes, and finally cooled by switching off the power source of the electric furnace. Accordingly, an $LiNbO_3$ film buffer layer having a film thickness of about 5 nm with an island-like structure was formed by solid phase epitaxial growth.

The above-mentioned 0.60M solution of double alkoxide was filtrated through a filter of 0.2 μm and spin coated at 2000 rpm on an MgO (111) single-crystalline substrate having an LiNbO$_3$ film buffer layer in an N$_2$ atmosphere. The spin coated substrate was heated at the rate of 10° C./sec in a dry O$_2$ atmosphere having a dew point of −60° C., maintained at 300° C. to form an amorphous film, then maintained at 700° C. for 30 minutes, and cooled at the rate of 60° C./min. Accordingly, an LiNbO$_3$ film having a film thickness of about 100 nm was formed by solidphase epitaxial growth. By repeating the operation again twice, an LiNbO$_3$ film having a film thickness of about 300 nm was formed by solid phase epitaxial growth to obtain an epitaxial LiNbO$_3$ film having a total film thickness of about 305 nm.

The X-ray diffraction pattern of the epitaxially crystallized LiNbO$_3$ film indicates only the diffraction peak at the (0001) face completely. A further analysis by the pole figure revealed that the crystal orientations of the MgO and LiNbO$_3$ in the substrate surface were identical. The X-ray diffraction rocking curve half width FWHM of the resulting epitaxial LiNbO$_3$ film at the (0006) face was 0.54°. The surface of the epitaxial LiNbO$_3$ film of the present example was observed with a high resolution SEM. It was found that the surface was smooth without a grain boundary or pores.

Example 6
(alteration of an organometallic compound)

LiOC$_2$H$_5$ and Ta(OC$_2$H$_5$)$_5$ of the equivalent molar amount were dissolved in 2-methoxyethanol (CH$_3$OC$_2$H$_4$OH) dehydrated with a molecular sieve having a boiling point at atmospheric pressure of 124.5° C. to obtain solutions of 0.06M and 0.6M. After a two hour distillation at 124.5° C. with stirring, followed by further reflux for 22 hours, double alkoxide Li[Ta (OC$_2$H$_4$OCH$_3$)$_6$] was obtained. The alcohol substitution reaction was confirmed by the $^1$H NMR spectrum. Then the above-mentioned 0.06M solution was filtrated through a filter of 0.2 μm and spin coated at 2000 rpm on a sapphire (0001) single-crystalline substrate. The above-mentioned operation was conducted in an N$_2$ atmosphere. Before the spin coating, the sapphire substrate was washed with a solvent, etched by HCl, rinsed with deionized water, and finally dried by spin coating with ethanol in N$_2$.

The spin coated substrate was heated at the rate of 20° C./sec in a dry O$_2$ atmosphere having a dew point of −60° C., maintained at 300° C. so as to form an amorphous film, then maintained at 700° C. for 30 minutes, and finally cooled by switching off the power source of the electric furnace. An LiTaO$_3$ thin film buffer layer of the film thickness of about 10 nm having an island-like structure was formed by the solid phase epitaxial growth.

The above-mentioned double alkoxide 0.6M solution was filtrated through a filter of 0.2 μm and spin coated at 2000 rpm on a sapphire (0001) single-crystalline substrate having an LiTaO$_3$ thin film buffer layer in an N$_2$ atmosphere. The spin coated substrate was heated at the rate of 20° C./sec in a dry O$_2$ atmosphere having a dew point of −60° C., maintained at 300° C. to form an amorphous film, then maintained at 700° C. for 30 minutes, and cooled at the rate of 20° C./min. Accordingly, an LiTaO$_3$ thin film having a film thickness of about 100 nm was formed by the solid phase epitaxial growth. By repeating the process again twice, an LiTaO$_3$ thin film having a film thickness of about 300 nm was formed by solid phase epitaxial growth to obtain an epitaxial LiTaO$_3$ thin film having a total film thickness of about 310 nm.

The X-ray diffraction pattern of the epitaxially crystallized LiTaO$_3$ thin film indicates the diffraction peak completely at only the (0001) face. A further analysis by the pole figure revealed that the crystal orientations of the sapphire and LiTaO$_3$ in the substrate surface were identical. The X-ray diffraction rocking curve half width of the obtained epitaxial LiTaO$_3$ thin film at the (0006) face was good, with a value of only 0.27°. The surface of the epitaxial LiTaO$_3$ thin film of the present embodiment was observed with a high resolution SEM. It was found that the surface was smooth without a grain boundary or pores.

Example 7
(utilizing different organometallic compounds for the ferroelectric buffer layer and the ferroelectric thin film)

As in the above examples, 0.06M solution of double alkoxide Li[Ta(OC$_2$H$_4$OCH$_3$)$_6$] was filtrated through a filter of 0.2 μm and spin coated at 2000 rpm on a sapphire (0001) single-crystalline substrate. The above-mentioned operation was conducted in an N$_2$ atmosphere. Before the spin coating, the sapphire substrate was washed with a solvent, etched by HCl, rinsed with deionized water, and finally dried by spin coating with ethanol in N$_2$.

The spin coated substrate was heated at the rate of 20° C./sec in a dry O$_2$ atmosphere having a dew point of −60° C., maintained at 300° C. to form an amorphous film, then maintained at 700° C. for 90 minutes, and finally cooled by switching off the power source of the electric furnace. An LiTaO$_3$ thin film buffer layer of the film thickness of about 10 nm having an island-like structure was formed by the solid phase epitaxial growth. The X-ray diffraction rocking curve half width of the LiTaO$_3$ thin film buffer layer was only 0.05°.

The above-mentioned double alkoxide Li[Nb (OC$_2$H$_4$OCH$_3$)$_6$] 0.6 M solution was filtrated through a filter of 0.2 μm and spin coated at 2000 rpm on a sapphire (0001) single-crystalline substrate having an LiTaO$_3$ thin film buffer layer in an N$_2$ atmosphere. The spin coated substrate was heated at the rate of 20° C./sec in a dry O$_2$ atmosphere having a dew point of −60° C., maintained at 300° C. so as to form an amorphous film, then maintained at 700° C. for 30 minutes, and cooled at the rate of 20° C./min. Accordingly, an LiNbO$_3$ film having a film thickness of about 100 nm was formed by the solid phase epitaxial growth. By repeating the process again twice, an LiNbO$_3$ film having a film thickness of about 300 nm was formed by solid phase epitaxial growth to obtain an epitaxial LiNbO$_3$/LiTaO$_3$ laminated film having a total film thickness of about 310 nm.

The X-ray diffraction pattern of the epitaxially crystallized LiNbO$_3$/LiTaO$_3$ laminated film indicates the diffraction peak completely at only the (0001) face. A further analysis by the pole figure revealed that the crystal orientations of the sapphire and LiNbO$_3$ in the substrate surface were identical. The X-ray diffraction rocking curve half width FWHM of the resulting epitaxial LiNbO$_3$ film at the (0006) face was good, with a value of only 0.26°. The surface of the epitaxial LiNbO$_3$ film of the present example was observed with a high resolution SEM. It was found that the surface was smooth without a grain boundary or pores.

Example 8
(alteration of an organometallic compound)

As in the above examples, KOC$_2$H$_5$ and Nb(OC$_2$H$_5$)$_5$ of the equivalent molar amount were dissolved in 2-methoxyethanol (CH$_3$OC$_2$H$_4$OH) and dehydrated with a molecular sieve having a boiling point at atmospheric pressure of 124.5° C. to obtain solutions of 0.06M and 0.6M. After a two hour distillation at 124.5° C. while stirring, followed by further reflux for 22 hours, double alkoxide K[Nb(OC$_2$H$_4$OCH$_3$)$_6$] was obtained. Then the above-mentioned 0.06M solution was filtrated through a filter of 0.2 μm and spin coated at 2000 rpm on an MgO single-crystalline substrate (100). The above-mentioned operation was conducted in an N$_2$ atmosphere. Before spin coating, the MgO substrate was washed with a solvent, etched by HCl, rinsed with deionized water, dried by spin coating with ethanol in N$_2$, and finally annealed at a high temperature in an O$_2$ atmosphere.

The spin coated substrate was heated at the rate of 10° C./sec in a dry O$_2$ atmosphere having a dew point of −60° C., maintained at 300° C. to form an amorphous film, then maintained at 700° C. for 90 minutes, and finally cooled by switching off the power source of the electric furnace. A KNbO$_3$ thin film buffer layer having a film thickness of about 10 nm with an island-like structure as shown in FIG. 3A and FIG. 3B were formed by the solid phase epitaxial growth.

The above-mentioned double alkoxide 0.6M solution was filtrated through a filter of 0.2 μm and spin coated at 2000 rpm on an MgO (100) single-crystalline substrate having a KNbO$_3$ thin film buffer layer in an N$_2$ atmosphere. The spin coated substrate was heated at the rate of 20° C./sec in a dry O$_2$ atmosphere having a dew point of −60° C., maintained at 300° C. to form an amorphous film, then maintained at 700° C. for 30 minutes, and cooled at the rate of 20° C./min. Accordingly, a KNbO$_3$ thin film having a film thickness of about 100 nm was formed by solid phase epitaxial growth. By repeating the process again twice, a KNbO$_3$ thin film having a film thickness of about 300 nm was formed by the solid phase epitaxial growth to obtain an epitaxial KNbO$_3$ thin film having a total film thickness of about 310 nm.

The X-ray diffraction pattern of the epitaxially crystallized KNbO$_3$ thin film indicates the diffraction peak completely at only the (100) face. A further analysis by the pole figure revealed that the crystal orientations of the MgO and KNbO$_3$ in the substrate surface were identical. The X-ray diffraction rocking curve half width FWHM of the obtained epitaxial KNbO$_3$ film at the (100) face was good, with a value of only 0.93°. The surface of the epitaxial KNbO$_3$ film of the present example was observed with a high resolution SEM. It was found that the surface was a smooth one without a grain boundary or pores.

Example 9

Lead acetate anhydride Pb(CH$_3$COO)$_2$, lanthanum isopropoxide La(O-i-C$_3$H$_7$)$_3$, and titanium isopropoxide Ti(O-i-C$_3$H$_7$)$_4$ were dissolved in 2-methoxyethanol (CH$_3$OC$_2$H$_4$OH). After a six hour distillation, followed by reflux for 18 hours, the precursor solution for PLT (28/100) of 0.06M and 0.6M in Pb concentration was obtained. Then the precursor solution was filtrated through a filter of 0.2 μm and spin coated on a sapphire (0112) single-crystalline substrate at 2,000 rpm under the N$_2$atmosphere. Before the spin coating, the sapphire substrate was washed with a solvent, etched by HCl, rinsed with deionized water, and finally dried by spin coating with ethanol under N$_2$.

The spin coated substrate was heated at the heating rate of 10° C./sec in an O$_2$ atmosphere with bubbling in deionized water at 1.0 L/min, maintained at 300° C., then maintained at 650° C., and finally cooled by switching off the power source of the electric furnace. Accordingly, a first buffer layer of PLT thin film having a film thickness of 10 nm with a continuous structure as shown in FIG. 1A and FIG. 1B were formed by the solid phase epitaxial growth. The X-ray diffraction pattern of the first PLT thin film indicates single orientation of the (110) face with the X-ray diffraction rocking curve half width FWHM at the (110) face of only 0.07°.

The precursor solution of 0.6M was spin coated on a sapphire (0112) single-crystalline substrate having the above-mentioned buffer layer of PLT thin film at 2,000 rpm under the N$_2$ atmosphere. The spin coated substrate was heated at the heating rate of 10° C./sec in an O$_2$ atmosphere with bubbling in deionized water, maintained at 300° C. for 2 min., then maintained at 650° C. for 30 min., and cooled. Accordingly, a PLT thin film having a film thickness of 100 nm was formed by the solid phase epitaxial growth. By repeating the above-mentioned operation again twice, a PLT film having a film thickness of about 300 nm was formed by solid phase epitaxial growth to obtain an epitaxial PLT film having a total film thickness of about 310 nm.

The X-ray diffraction pattern of the epitaxially crystallized PLT film indicates only the diffraction peak at the (110) face completely. The X-ray diffraction rocking curve half width FWHM of the epitaxial PLT film at the (110) face was good, having a value of only 0.40°.

Example 10

As in Example 1, a 0.06M solution of double alkoxide Li[Nb(OC$_2$H$_4$OCH$_3$)$_6$] was filtrated through a filter of 0.2 μm and spin coated on a sapphire (0001) single-crystalline substrate at 2,000 rpm under the N$_2$ atmosphere. Before the spin coating, the sapphire substrate was washed with a solvent, etched by HCl, rinsed with deionized water, and finally dried by spin coating with ethanol under N$_2$.

The spin coated substrate was heated at the heating rate of 20° C./sec in a dry O$_2$ atmosphere having a dew point of −60° C., maintained at 300° C., then maintained at 700° C. for 2 min., and finally cooled by switching off the power source of the electric furnace. By repeating the above-mentioned operation again twice, a buffer layer of a LiNbO$_3$ film having a total film thickness of about 30 nm with a continuous structure as shown in FIG. 1A and FIG. 1B were formed by the solid phase epitaxial growth.

A 0.6M solution of double alkoxide Li[Nb(OC$_2$H$_4$OCH$_3$)$_6$] was filtrated through a filter of 0.2 μm and spin coated on a sapphire (0001) single-crystalline substrate with the buffer layer of the LiNbO$_3$ film at 2,000 rpm under the N$_2$ atmosphere. The spin coated substrate was heated at the heating rate of 20° C./sec in a dry O$_2$ atmosphere having a dew point of −60° C., maintained at 300° C., then maintained at 700° C. for 30 min., and cooled at the cooling rate of 20° C./min. Accordingly, a LiNbO$_3$ film having a film thickness of about 100 nm was formed by the solid phase epitaxial growth. By repeating the above-mentioned operation again four times, a LiNbO$_3$ film having a film thickness of about 500 nm was formed by the solid phase epitaxial growth to obtain an epitaxial LiNbO$_3$ film having a total film thickness of about 530 nm.

The X-ray diffraction pattern of the epitaxially crystallized LiNbO$_3$ film indicates only the diffraction peak at the (0001) face completely, as described in Example 1. The X-ray diffraction rocking curve half width FWHM of the epitaxial LiNbO$_3$ film at the (0006) face was good, having a value of only 0.25°. It was found by observation with high resolution SEM that the surface of the epitaxial LiNbO$_3$ film was smooth without a grain boundary or pores.

What is claimed is:

1. A production method of a ferroelectric thin film element, comprising a step of performing a first solid phase epitaxial growth process where a first organometallic compound is applied on the single-crystalline substrate and heated to produce a ferroelectric buffer layer having a composition different from a single-crystalline substrate on the single-crystalline substrate with a film thickness of 1 nm to 40 nm, and a step of forming a ferroelectric thin film layer on the ferroelectric buffer layer by at least once performing a second solid phase epitaxial growth process where a second organometallic compound is applied on the layer of the former process and heated to form a ferroelectric single layer thin film with a film thickness of 10 nm or more and being thicker than the ferroelectric buffer layer.

2. The production method of a ferroelectric thin film element according to claim 1, wherein the ferroelectric buffer layer and the ferroelectric thin film layer comprise an oxide ferroelectric.

3. The production method of a ferroelectric thin film element according to claim 2, wherein the ferroelectric buffer layer and the ferroelectric thin film layer comprise an oxide represented by a chemical formula $ABO_3$ (wherein the element A contains at least Li, K, or Li and K, and the element B contains Nb, Ta, or Nb and Ta), and the compositions of the ferroelectric buffer layer and the ferroelectric thin film layer are the same or different.

4. The production method of a ferroelectric thin film element according to claim 1, wherein the X-ray diffraction rocking curve half width of the ferroelectric buffer layer is 0.5° or less.

5. The production method of a ferroelectric thin film element according to claim 1, wherein the ferroelectric buffer layer has a discontinuous island-like structure.

6. The production method of a ferroelectric thin film element according to claim 1, wherein the single-crystalline substrate comprises $Al_2O_3$, $LiTaO_3$, MgO, $MgAl_2O_4$, or ZnO.

7. The production method of a ferroelectric thin film element according to claim 1, wherein the first and second organometallic compound is a mixture of a plurality of organic compounds selected from the group consisting of metal alkoxides and organometalic salts, or a reaction product of a plurality of organometallic compounds.

8. The production method of a ferroelectric thin film element according to claim 1, wherein the heating processes include at least an epitaxial heating process at the temperature range of 300° C. to 1200° C. to cause the solid phase epitaxial growth, preceded by (a) an amorphous process comprising a step of heating at the temperature range of from 100° C. to 500° C. to have the applied thin film become amorphous by thermal degradation, or (b) an intermediate process comprising a step of heating at the temperature range of from 300° C. to 900° C. where the temperature is lower than the homogeneous nucleus generation temperature of the random crystal nucleus in the thin film on the substrate and higher than the heterogeneous nucleus generation temperature of the epitaxial crystal nucleus, or (c) the amorphous process followed by the intermediate process.

9. A ferroelectric thin film element, comprising a single layer ferroelectric buffer layer formed on a single crystal substrate and a ferroelectric thin film layer of a single layer or a plurality of layers formed on the ferroelectric buffer layer, wherein the ferroelectric buffer layer has a film thickness of 1 nm to 40 nm and the composition differs from that of the single-crystalline substrate, formed by the solid phase epitaxial growth, and the ferroelectric thin film layer comprising a single layer or a plurality of layers has each layer having a thickness of 10 nm or more, and being thicker than the ferroelectric buffer layer, formed by the solid phase epitaxial growth.

10. The ferroelectric thin film element according to claim 9, wherein the ferroelectric buffer layer and the ferroelectric thin film layer comprise an oxide represented by a chemical formula $ABO_3$ (wherein the element A contains Li, K, or Li and K, and the element B contains Nb, Ta, or Nb and Ta), and the compositions of the ferroelectric buffer layer and the ferroelectric thin film layer are the same or different.

11. The ferroelectric thin film element according to claim 9, wherein both the X-ray diffraction rocking curve half widths of the ferroelectric buffer layer and the ferroelectric thin film layer are 1.0° or less.

12. The ferroelectric thin film element according to claim 9, wherein the single-crystalline substrate comprises $Al_2O_3$, $LiTaO_3$, MgO, $MgAl_2O_4$, or ZnO.

13. A production method of a ferroelectric thin film element comprising the steps of:

performing a first solid phase epitaxial growth process where a first organometallic compound is applied on the single-crystalline substrate and heated to form a first ferroelectric buffer layer on a single-crystalline substrate having a thickness of 1 nm to 40 nm which composition is different from that of the substrate;

performing a second solid phase epitaxial growth process at least once where a second organometallic compound is applied on the layer formed on the former process and heated to form a second or later ferroelectric buffer layer having a thickness of 1 nm to 40 nm on the single-crystalline substrate; and performing a third solid phase epitaxial growth process at least once where a third organometallic compound is applied on the layer formed in the former process and heated to form a ferroelectric thin film layer having a thickness of 10 nm or more, and being thicker than the ferroelectric buffer layer.

14. A ferroelectric thin film element, comprising a ferroelectric buffer layer of a single layer or a plurality of layers formed on a single crystal substrate and a ferroelectric thin film layer of a single layer or a plurality of layers formed on the ferroelectric buffer layer, wherein the ferroelectric buffer layer comprising a single layer or a plurality of layers has each layer having a film thickness of 1 nm to 40 nm and which composition is different from that of the single-crystalline substrate, formed by the solid phase epitaxial growth, and the ferroelectric thin film layer comprising a single layer or a plurality of layers has each layer having a film thickness of 10 nm or more, and being thicker than the ferroelectric buffer layer, formed by the solid phase epitaxial growth.

* * * * *